United States Patent
Cowles et al.

(10) Patent No.: US 6,526,533 B1
(45) Date of Patent: Feb. 25, 2003

(54) SEMICONDUCTOR MEMORY IMPLEMENTING INTERNALLY GENERATED COMMANDS

(75) Inventors: Timothy B. Cowles; Jeffery P. Wright, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/656,586

(22) Filed: Sep. 6, 2000

Related U.S. Application Data

(62) Division of application No. 09/093,967, filed on Jun. 8, 1998, now Pat. No. 6,253,340.

(51) Int. Cl.$^7$ ............................................. G11C 29/00
(52) U.S. Cl. ..................... 714/718; 711/105; 714/763
(58) Field of Search ................................ 714/718, 763; 711/105, 100

(56) References Cited

U.S. PATENT DOCUMENTS 6,032,220 A * 2/2000 Martin et al. ................ 711/105
6,192,446 B1 * 2/2001 Mullarkey .................. 711/105

* cited by examiner

*Primary Examiner*—Phung M. Chung

(57) ABSTRACT

Systems, methods and apparatus for accessing integrated circuits, such as semiconductor memories and particularly in testing, by reducing the number of clock cycles required to apply sequences of command and address signals to a m-dimensional structure of such integrated circuit, such as a memory array. The system, methods and apparatus comprise structure and steps by which commands are issued responsive to external controls signals and commands are generated independent of such signals, such commands being communicated internal to the integrated circuit via separate data paths.

20 Claims, 9 Drawing Sheets

SEMICONDUCTOR MEMORY IMPLEMENTING INTERNALLY GENERATED COMMANDS

CROSS REFERENCE TO RELATED APPLICATIONS

This is a divisional of application Ser. No. 09/093,967, filed on Jun. 8, 1998 now U.S. Pat. No. 6,253,340.

BACKGROUND OF THE INVENTION

The invention relates generally to integrated circuits, and more particularly to integrated circuits that implement internally generated commands.

Consumer electronic devices and computers are on a path of advancing power. Contributing to this advance are developments in integrated circuits, including semiconductor memories. To illustrate, in the past twenty years semiconductor memories have increased in capacity (i.e., the number of memory bits per unit) by over a thousand fold. However, capacity increases have generally not been matched by correlative improvements directed to accessing memory's storage locations, e.g., by substantial reductions in the number of cycles consumed in accessing a certain proportion of the memory's storage locations. As such, writing and/or reading to a substantial proportion of a memory—as may arise during testing and/or during certain non-test operations (e.g., graphics and other media-related)—can be undesirably slow.

Developments in semiconductor memories have been marked not only by improvements in capacity, but also by great reductions in unit cost. Unit costs are a function of the investment costs associated with building and equipping modern semiconductor facilities. Moreover, unit costs are a function of the facilities' operating costs, such operating costs typically including each of fabrication and test costs.

Fabrication generally is a batch process that provides for amortizing the investment and fabrication costs over a high volume of units and, accordingly, tends to decrease unit costs. Testing, however, tends to increase unit costs. The cost benefits of batch fabrication and the cost detriments of testing tend to apply in like character across integrated circuits.

The costs of testing generally occurs in several stages. To illustrate, testing of memory units typically is performed by the semiconductor manufacturer prior to shipping the units to system producers. Moreover, system producers may test the systems that incorporate the units, and the producers' customers may test the systems in the field. In any case, each test has an allocable cost and, therein, tends to increase the unit cost associated with the semiconductor memories.

Prior to shipment of units, the manufacturer typically tests the units in two phases. The first phase is generally referred to as "wafer probe" or "wafer sort". This phase includes the testing the functional and/or parametric performance of the semiconductor memory as individual integrated circuits, typically while the integrated circuits are still in wafer form, i.e., before the integrated circuit has been cut apart from the wafer and while any special test pads are accessible. The second phase is typically referred to as "final test". This phase includes the testing of functional and/or parametric performance of the semiconductor memory as individually packaged integrated circuits, typically using external pins of the circuit.

Per-unit test cost is a function of both the number of, and the cost per, testing cycle. Integrated circuits generally require numerous testing cycles in order to verify proper operation. As integrated circuits gain complexity, the number of testing cycles tends to increase. For example, with semiconductor memories the testing cycles typically are employed to write and read test data (i.e., various combinations of logical ones and zeroes) to and from storage locations of a unit under test. As the number of tested storage locations increases from its already relatively large number, the employed test cycles have tended to be increasing from an already relatively large number. Accordingly, testing of large-capacity semiconductor memories, assuming a fixed test cost per testing cycle, tends to engender a significant per-unit test cost.

Generally, statistical analysis has been employed to reduce the number of testing cycles, e.g., by reducing the number of units tested from a batch and/or by the number of storage locations tested per average unit. Even with statistics-based reductions, large and increasing memory capacities generally tend to correspond to a relatively large number of testing cycles. Beyond the statistical reductions, reduction in the number of testing cycles may be obtained by improving the process for accessing storage locations. As previously stated, such access improvements can also be desirable in certain nontest operations.

Accordingly, a need exists for methods and apparatuses for effectively accessing integrated circuits, particularly semiconductor memories.

SUMMARY OF THE INVENTION

In one aspect of the present invention, systems, circuits and methods are provided for effectively accessing integrated circuits by implementing internally generated commands associated with access.

In a more specific aspect of the present invention, systems, circuits and methods are provided that enable access of a memory's storage locations, particularly for testing, by implementing internally generated commands to reduce the clock cycles associated with performing certain access sequences. The number of clock cycles are reduced, broadly, by reducing the number of external control signals (and eliminating provision of such signals' associated address information) engendered by access sequences. These external control signals are replaced by certain internally generated commands which are (i) generated concurrently with certain commands issued responsive to external control signals and (ii) communicated via data paths distinct from such issued commands so as to preclude resource conflict there between. The address information associated with such internally generated commands preferably is determined from the address information associated with one or more of the remaining external control signals.

In one embodiment of the present invention, the apparatus includes (a) a command generator that internally generates one or more commands in place of commands that otherwise might be issued responsive to external control signals, (b) a command coordinator that coordinates such generated commands with issued commands, the issued commands being issued responsive to external control signals and (c) an m-dimensional structure of redundant circuits that are accessible individually or in groups. The embodiment further comprises, in another aspect, a mode register for enabling one or more modes, including a mode which employs internal generation of commands.

The various features of novelty which characterize the invention are pointed out with particularity in the claims annexed to and forming a part of this specification. For a better understanding of the invention, its operating advantages and specific objects attained by its use, reference should be made to the accompanying drawings and descriptive matter in which its preferred embodiments are illustrated and described, wherein like reference numerals identify the same or similar elements.

DETAILED DESCRIPTION

Semiconductor memories, generally, comprise integrated circuits having a memory array and peripheral circuitry. The memory array typically includes memory specific elements, including one or more of, among others, memory cells, bit lines, bit line load devices, wordlines, wordline drivers, and bit line prechargers. Peripheral circuitry typically includes interface specific elements, including, among others, input buffers, output buffers, and electrostatic discharge protection circuits.

Figure 1:
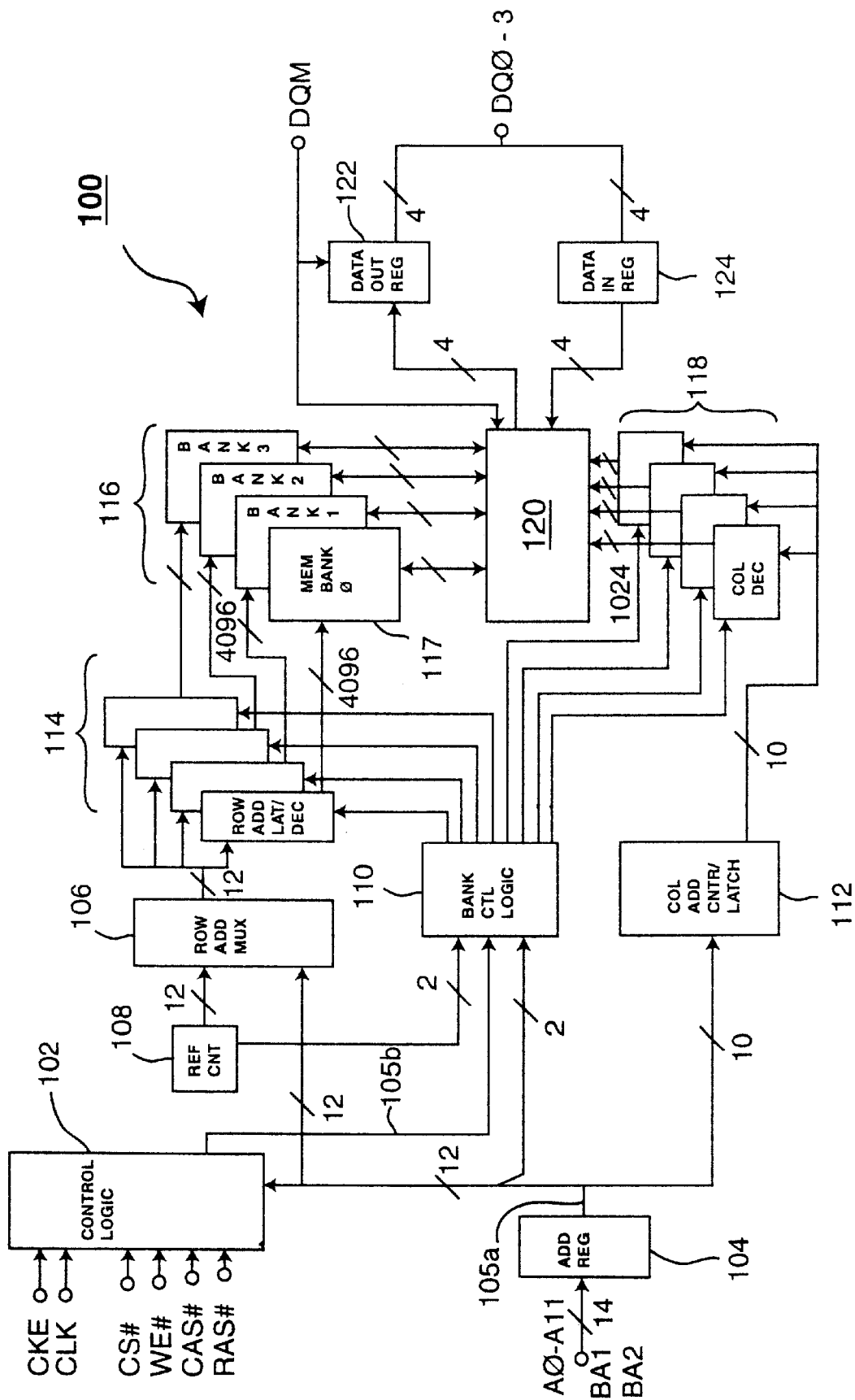
FIG. 1 is a block diagram of a exemplary synchronous dynamic random access memory (SDRAM).

FIG. 1 shows a block diagram of an exemplary synchronous dynamic random access memory (SDRAM) 100. SDRAM 100 comprises control logic 102 that is configured to have applied thereto external control signals. Typical external control signals include, for example, a chip select (CS#), a write enable (WE#), a column address strobe (CAS#), a row address strobe (RAS#), a clock enable (CKE) and a clock signal (CLK). In a typical embodiment, each of these control signals is low active.

Responsive to applied external control signals, the control logic 102 issues various internal control signals. Typically, the control logic 102 issues internal control signals based on decoding a set of external control signals, e.g., a selected internal control signal is issued based on receipt of a predetermined individual or combination of asserted and/or non-asserted external control signals. The so-issued internal control signals typically include selected commands, e.g., activating and access commands.

The internal control signals are typically employed to control the SDRAM's operations. To do so, the internal control signals are provided to elements of the SDRAM 100 by couplings between the control logic 102 and selected such SDRAM elements. For example, the control logic 102 is coupled to bank control logic 110. Other such couplings are well understood by those having skill in the art of semiconductor memories and, accordingly, are not further described.

The SDRAM 100 also comprises an address register 104. The address register 104 is configured to receive and latch address information, such information being employed to select banks, rows and columns of the memory array 117. The output of the address register 104 is coupled to the control logic 102, as well as to each of bank control logic 110, column address counter/latch 112 and row address multiplexer 106.

The SDRAM 100 also comprises a refresh counter 108. The output of the refresh counter 108 is coupled to each of the row address multiplexer 106 and to the bank control logic 110. The operation of the refresh counter 108 is well understood by those having skill in the art of semiconductor memories and, accordingly, is not further described.

The output of the row address multiplexer 106 is coupled to respective row address latch/decoders 114, each such latch/decoder being coupled to a respective one of the memory banks 116. The bank control logic 110 is coupled to row address latch/decoders 114 so as to control latching of address information from the row address multiplexer 106 to a selected latch/decoder 114.

The bank control logic 110 is also coupled to column decoders 118 so as to control latching of address information from the column address counter/latch 112 to a selected column decoder 118. Also coupled to column decoders 118 is the output of the column address counter/latch 112.

Memory banks 116 and column decoders 118 are coupled at their respective outputs to functional logic block 120. Functional logic block 120 is also coupled to a data output register 122 and to a data input register 124 so as to provide, respectively, for outputting and inputting data DQ0–3. Functional logic block 120 is configured to perform several functions, including latching read data and driving write data. Functional logic block 120 receives, and is responsive to, external control signal DQM, such signal enabling input/output.

As depicted in FIG. 1, SDRAM 100 has a storage capacity of 64 Mb and is organized so that each bank's memory array 117 has a capacity of 16 Mb. Each memory array 117, in turn, is organized in 4,096 rows and 1,024 columns, each row-column combination defining a four-bit wide storage location. It is to be understood that the semiconductor memory may comprise some other storage capacity and may be otherwise organized, without departing from the principles of the invention. To illustrate in the context of an SDRAM, the banks 116 and the memory arrays' columns can each be greater or lesser in number (e.g., all other things being unchanged, the number of columns per array 117 can be 512, provided each storage location is 8 bits wide).

In this illustrative embodiment, the external control signals—such as those applied to control logic 102—are registered on a selected edge (e.g., the positive/rising edge) of a clock cycle. Similarly, address information applied at the address register 104 is registered on the selected edge of a clock cycle. Moreover, internal control signals—such as those issued by the control logic 102—typically are registered on the selected edge of a clock cycle.

According to standard operation, SDRAM 100 supports accessing one or more storage locations according to a predetermined access process. Accordingly to such process, the SDRAM 100 initially issues an activating command, e.g., ACTIVE. As depicted, the SDRAM's control logic 102 issues the ACTIVE command to the bank control logic 110 responsive to a first selected combination of external control signals. The so-issued ACTIVE command is associated both with a particular row and, because the SDRAM 100 is organized having banks, with a particular bank. The row and bank are described by address information latched by the address register 104. Accordingly, the ACTIVE command and its address information are employed to activate the particular row of the particular bank.

The ACTIVE command advances the access process to the threshold of accessing selected storage locations of the activated row. Such access generally contemplates one or more access commands to drive read and/or write operations. To perform a read operation, the SDRAM 100 issues a READ command, the READ command being used to initiate a read access of an activated row. As depicted, the SDRAM's control logic 102 issues the READ command to the bank control logic 110 responsive to (e.g., decoded from) a second selected combination of external control signals. The so-issued READ command typically is associated with a particular column of the activated bank. The column is described by address information latched by the address register 104. Because more than one bank can be active, the so-latched address information typically also references the applicable bank. The address information and the READ command are employed to select a column and otherwise control access of storage locations in the activated row. The contents of the storage locations ultimately are output using functional logic block 120 and the data output register 122, subject to applied I/O control signal DQM.

To perform a write operation, the SDRAM 100 issues a WRITE command, the WRITE command being used to initiate a write access of an activated row. As depicted, the SDRAM's control logic 102 issues the WRITE command to the bank control logic 110 responsive to (e.g., decoded from) a third selected combination of external control signals. The so-issued WRITE command typically is associated with a particular column of the activated bank. The column is described by address information latched by the address register 104. Because more than one bank can be active, the so-latched address information typically also references the applicable bank. The address information and the WRITE command are employed to select a column and otherwise control access of storage locations in the activated row. The contents of the storage locations ultimately are input using functional logic block 120 and the data input register 124, subject to applied I/O control signal DQM.

Figure 2A:
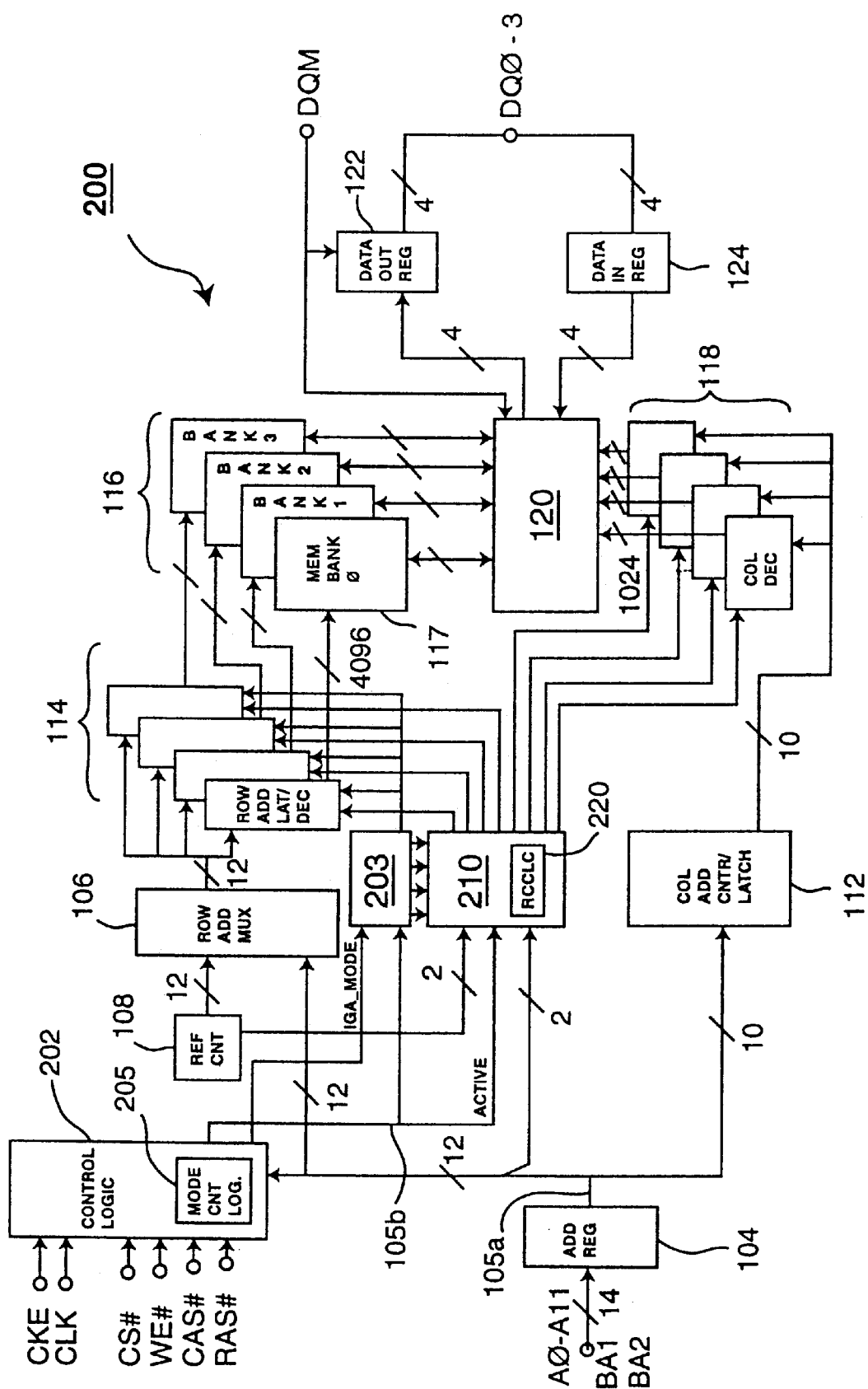
FIG. 2(a) is a block diagram of a SDRAM in accordance with the present invention.

The above-described standard operation preferably supports burst accesses. Burst access typically is supported in conjunction with a burst access terminate option. A burst access comprises an access (e.g., for reading or writing) that starts at a selected storage location and continues for a selected number of successive locations ("burst length") in a programmed, columnar sequence for an active row. Supported burst lengths include, for example, 1, 2, 4, or 8 storage locations, a full page, or otherwise. In FIGS. 1 and 2(a), the burst length and sequence are provided employing the column address counter/latch 112, as is understood by those of skill in the art.

Reflecting the synchronous architecture of SDRAM 100, control logic 102 registers the applied, external control signals on a selected edge of a clock cycle. Moreover, control logic 102 decodes such registered signals for issuance of correlative internal control signals and commands.

Accordingly, an ACTIVE command is issued upon registration and decoding of applied, external control signals that correlate to such command. In turn, READ and WRITE commands are issued upon registration and decoding of applied, external control signals that correlate to respective such commands. Moreover, the address information associated respectively with an ACTIVE, READ or WRITE command is registered by the address register 104, such information being generally coincident with the external control signals correlating to the registered command.

In an illustrative example, an ACTIVE command is decoded from and issued based upon registration of both an asserted CS# (low active chip select) and an asserted RAS# (low active row address strobe), while both CAS# (low active column address strobe) and WE# (low active write enable) are not asserted. The ACTIVE command's associated bank is determined from the values that the address register 104 registers via external inputs BA0 and BA1, the two bits being sufficient to select among the four memory banks 116 of SDRAM 100. Similarly, the ACTIVE command's associated row is determined from the values that the address register 104 registers via external inputs A0–A11, the twelve bits being sufficient to select among the 4096 rows of each memory bank 116 of SDRAM 100.

Following the ACTIVE command in this illustrative example, the selected row of the selected bank is active for accesses. The row remains active until a PRECHARGE command is issued in association with that selected bank. In that regard, a PRECHARGE command is issued when selecting a different row of that selected bank.

Moreover, in this illustrative example, a READ command is decoded from and issued based upon registration of both an asserted CS# and an asserted CAS#, while both RAS# and WE# are not asserted. In turn, a WRITE command is decoded from and issued based upon registration of an asserted CS#, an asserted CAS# and an asserted WE#, while RAS# is not asserted. A READ or WRITE command's associated bank and column are determined (a) for banks, from the values registered via external inputs BA0 and BA1 and (b) for columns, from the values registered via external inputs A0–A9, these latter ten bits being sufficient to select among the 1024 columns of each memory array 117 of the memory banks 116.

Those skilled in the art will appreciate that, for the purposes of this disclosure, a reference to the application of an external control signal (such as CS#, RAS#, CAS# and WE#) contemplates that the signal is applied to an input terminal of a semiconductor memory discussed herein by coupling such terminal to one or more signal sources and, in turn, the signal sources are controlled to drive the control signal to a selected state, the state typically being a voltage representing a logical one or zero (e.g., low active denotes). Those skilled in the art will also appreciate that signal sources may be test equipment, memory controller circuits, microprocessors or other circuitry. In addition, however, those skilled in the art will appreciate that one or more of the signal sources may be internal or external to an integrated circuit within which the semiconductor memory is embedded, without departing from the principles of the invention.

Referring to FIG. 2(a), a block diagram of a quad bank SDRAM 200 in accordance with the present invention is shown. SDRAM 200 is architecturally similar to SDRAM 100 of FIG. 1, with like structure bearing like reference numerals and providing for standard mode operation as described above. However, SDRAM 200 includes (i) control logic 202 comprising mode logic decoder 205, (ii) command generator 203 and (iii) bank control logic 210 comprising one or more row chain control logic circuits 220. SDRAM 200, so architectured, provides for non-standard mode operations. In particular, DRAM 200 provides for internally generating, at selected relative times and under selected circumstances, one or more predetermined commands in place of issuing commands responsive to applied external control signals.

Control logic 202 comprises mode logic decoder 205 for enabling the mode of operation. Mode control logic 205 preferably is employed both (a) toward determining the implicated mode and (b) enabling operation of the semiconductor memory under the implicated mode. Mode control logic 205 can be variously implemented, including by providing logic that decodes external control signals corresponding to loading of a mode (i.e., mode load signals), as well as by providing logic that recognizes patterns of external control signals, address information and/or storage location contents, so as to adaptively determine/enable modes.

So comprised, control logic 202 issues internal control signals appropriate to the implicated mode, including any non-standard mode. To illustrate, control logic 202 asserts an IGA_MODE control signal which asserted signal is employed to enable the semiconductor memory's operation in a non-standard mode characterized by internal generation of commands corresponding in function to ACTIVE commands. It is to be recognized that, if SDRAM 200 supports generation of other internal commands, respective internal control signals preferably are supported toward enabling such generation. It is also to be recognized that such enabling, internal control signals preferably are provided by the mode control logic 205.

Control logic 202 also provides commands and other internal control signals appropriate to standard mode operation. To illustrate, control logic 202 decodes ACTIVE commands from external control signals, which commands correspond to the above-described ACTIVE commands of SDRAM 100 and, as such, are employed to activate a selected row in a memory bank 116.

Control logic 202 is coupled to command generator 203. So coupled, command generator 203 receives one or more internal control signals from control logic 202. For example, as shown, command generator 203 receives both ACTIVE commands and IGA_MODE control signals. Responsive thereto, command generator 203 generates one or more control signals, including internally generated ACTIVE (IGA) commands and a latching signal. The IGA commands, so generated, are provided to bank control logic 210. The latching signal, so generated, is provided to each of the row address latch/decoders 114. It is preferred that the latching signal provides for latching an ACTIVE command's row address from the row address multiplexor 106 into all memory banks 116, so as to override, in IGA mode, the standard operation of the bank control logic 210 as to control of the latch/decoders 114.

Figure 2B:
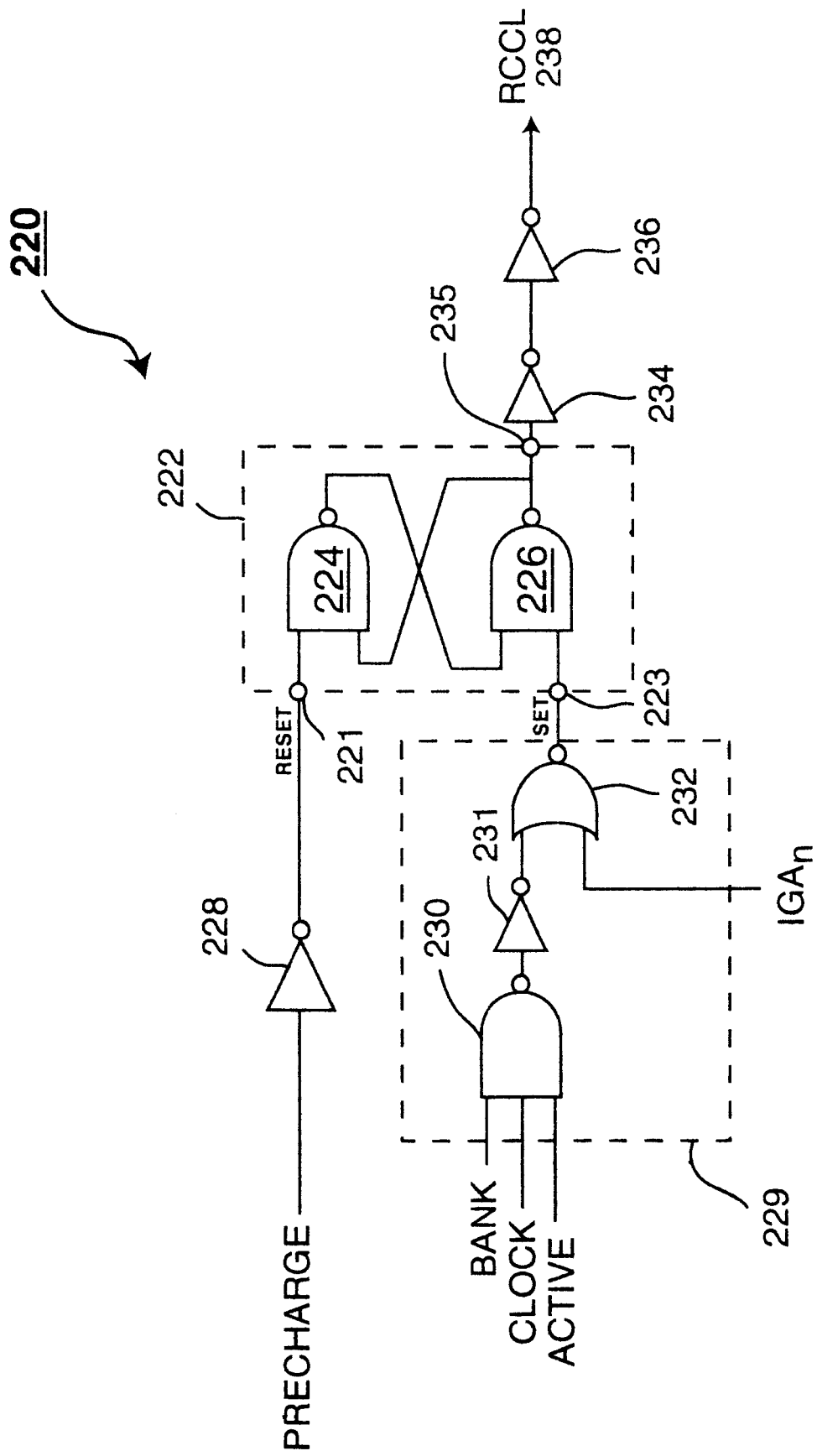
FIG. 2(b) is a schematic diagram of a logic circuit employable to activate rows, in accordance with the present invention.
Figure 2C:
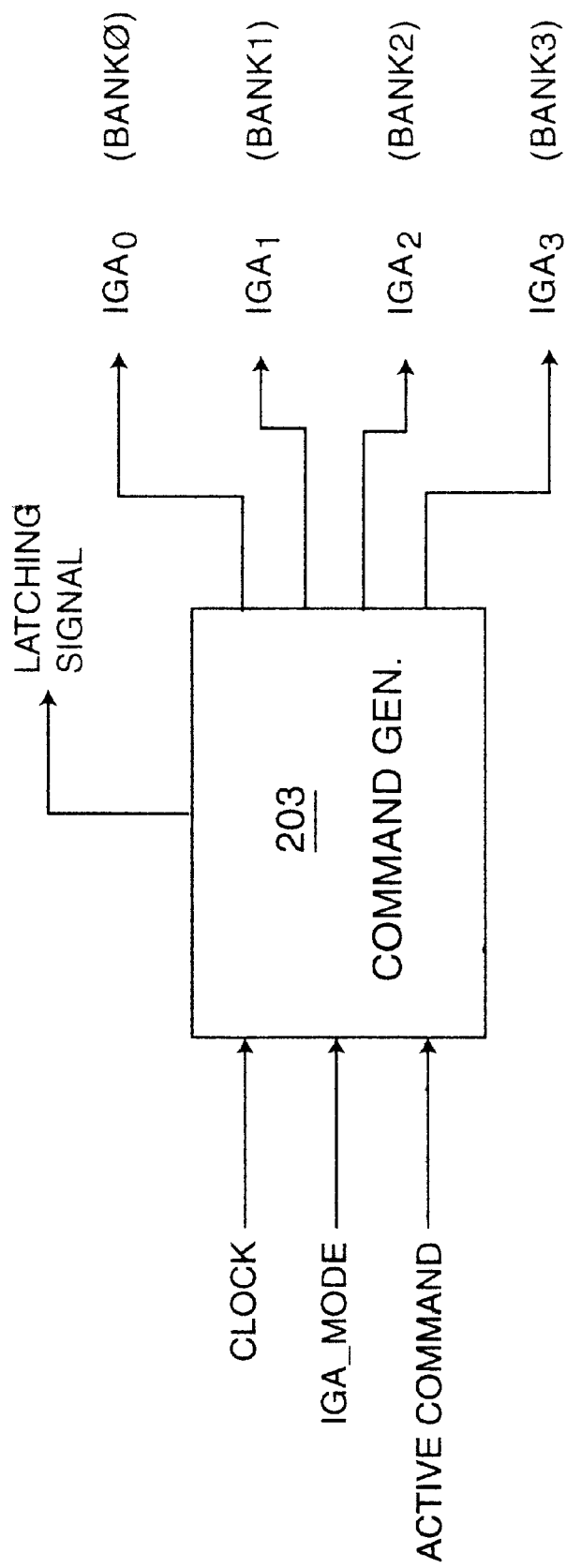
FIG. 2(c) is a schematic block diagram of a logic circuit employable to internally generate commands, in accordance with the present invention.

Referring to FIG. 2(c), a general embodiment of command generator 203 is shown. In this general embodiment, command generator 203 is configured to receive the CLOCK, the ACTIVE command and the IGA_MODE control signal. The command generator 203, so-configured, is employed to generate commands $IGA_0$, $IGA_1$, $IGA_2$, and $IGA_3$, each such command being associated with a respective one of the banks 116 of illustrated SDRAM 200. The IGA commands comprise internally generated ACTIVE commands and, accordingly, have function corresponding to ACTIVE commands issuable from time to time by the control logic 202 responsive to external control signals.

In a typical embodiment, command generator 203 comprises a counter. The counter provides for generating IGA commands responsive to a proper combination of a CLOCK, an IGA_MODE control signal and an ACTIVE command. As an example, the counter is employable to sequentially generate IGA commands, bank-by-bank, provided that (i) the correlative non-standard mode is enabled via an IGA_MODE control signal and (ii) either a valid, initial ACTIVE command is received or some predetermined calculus or stimulus occurs. As to the latter, once generation of IGA commands has been initiated in a synchronous embodiment, clock cycles preferably trigger generation of IGA commands respecting and across the implicated group of banks 116. Moreover, the counter generates each IGA command (a) in the absence of and without dependence on application of external control signals (cf., external control signals triggering issue of a corresponding ACTIVE command) and (b) in the absence of substantially coincident application of associated row/bank address information. Accordingly, the IGA commands do not consume bandwidth of data paths 105a, 105b by which issued commands and associated address information is conveyed internal to the SDRAM 200, thereby enabling reduction of total clock cycles for accessing the SDRAM 200 across banks 116 in an access sequence.

For the illustrated quad-bank SDRAM 200, the command generator 203 can be implemented using a three-clock counter. In that case, the initial ACTIVE command triggers the command generator's sequential generation among commands $IGA_1$, $IGA_2$, and $IGA_3$. In an alternative case, the command generator 203 can be implemented using a four-clock counter, whereby the initial ACTIVE command triggers the command generator's sequential generation among commands $IGA_0$, $IGA_1$, $IGA_2$, and $IGA_3$. In either case, it is preferred that the generated commands follow an order (the order may be other than that indicated by the numerical subscripts of such IGA commands) conforming to a selected access sequence.

Although a counter is described, those skilled in the art will recognize that the functionality of command generator 203 can be implemented other than by using a counter. As an example, the command generator 203 can be implemented using shift registers.

Moreover, although IGA commands are described above as being generated on consecutive clock cycles, it is understood that the generation of commands may be otherwise performed. For example, clock cycles can be interposed variously between adjacent, generated commands, without departing from the principles of the invention.

Figure 3A:
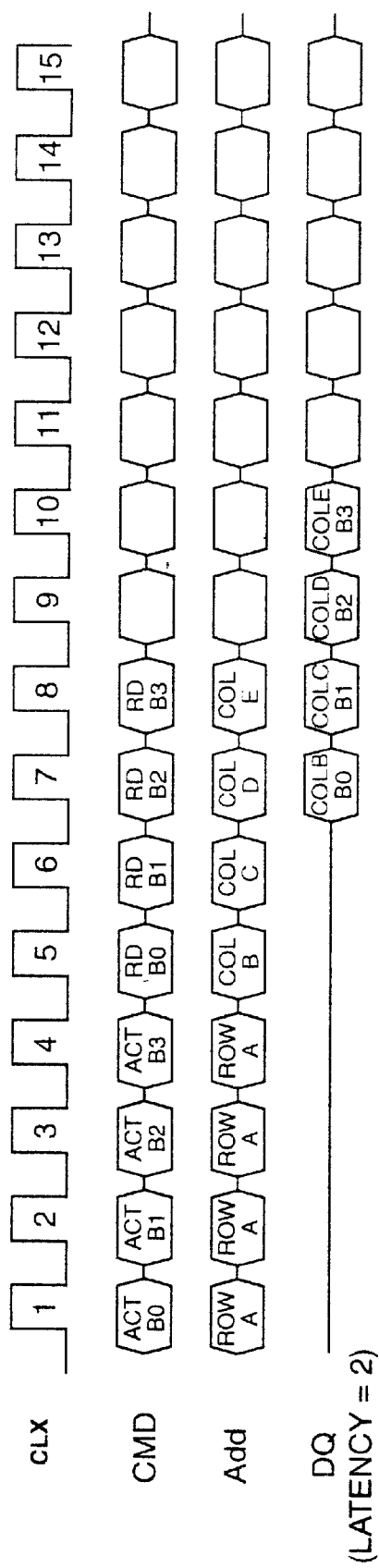
FIG. 3(a) is a timing diagram illustrating timing of the SDRAM of FIG. 2(a) operating in accordance with the present invention.
Figure 3B:
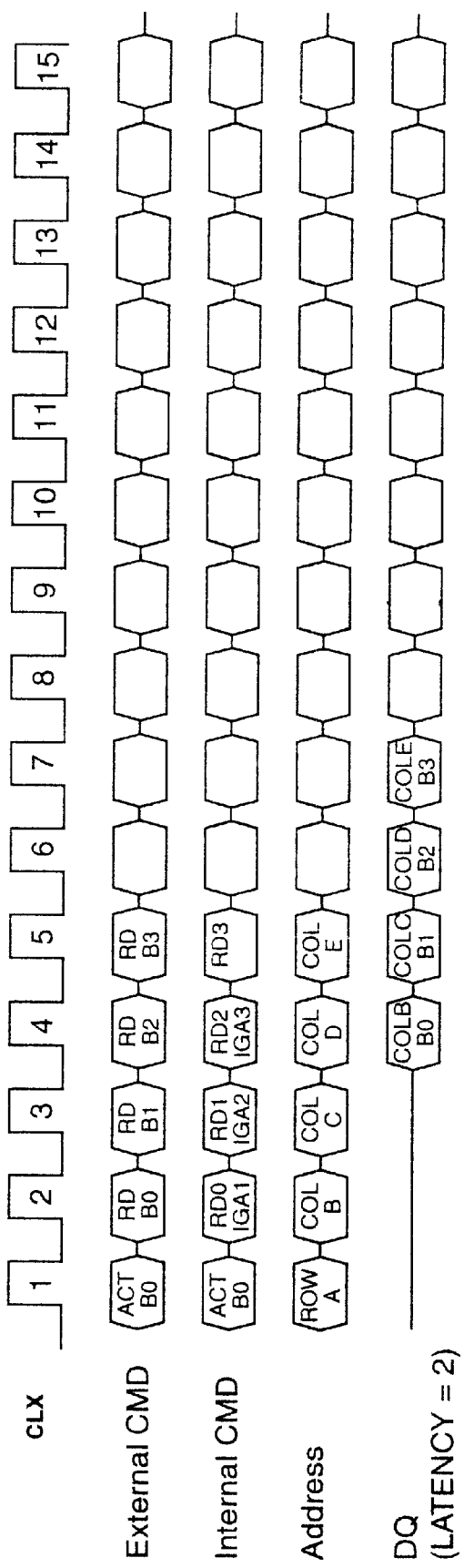
FIG. 3(b) is a timing diagram illustrating timing of the SDRAM of FIG. 2(a) operating .in accordance with the present invention.
Figure 3C:
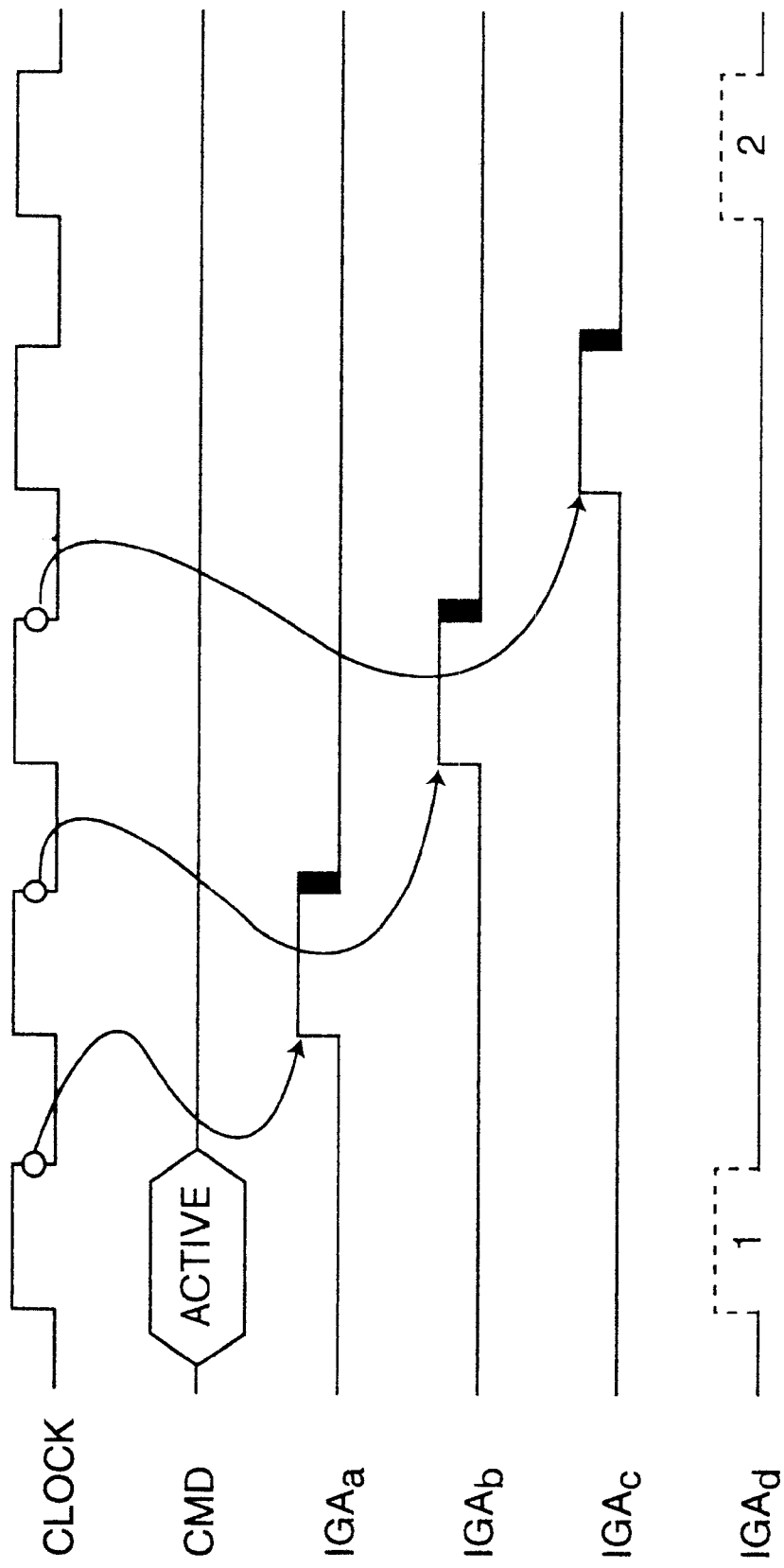
FIG. 3(c) is a timing diagram illustrating operations of the circuit of FIG. 2(c).

FIG. 3(c) shows an example timing diagram illustrating operations of command generator 203. Therein, (a) CMD depicts the applied external control signals corresponding to an ACTIVE command associated with a particular bank (and row) and (b) commands $IGA_{a-d}$ are generated one at a time in a selected order, and on consecutive clock cycles, in association with respective banks of the SDRAM 200. The legends $IGA_{a-d}$ are employed to indicate that command generator 203 can be configured either/both to begin generating IGA commands for any particular bank and to continue generating IGA commands, in a selected order, following generation of the final IGA command in the sequence's order ("wrap around").

As an example, using the quad bank SDRAM 200 and provided an initial ACTIVE command is issued for memory bank 2, command generator 203 can be configured to generate IGA commands sequentially, in order, for bank 3, bank 0 and bank 1 (i.e., a=3, b=0, and c=1 for IGA$_{a-c}$). As an extension on this example, the command generator 203 can be configured to wrap around after IGA$_1$, as depicted in FIG. 3(c) by the second dashed IGA$_d$, where d=2. In any case, it is to be understood that generation of IGA commands can be provided in other selected order and/or in other selected timing relationship, without departing from the principles of the present invention.

As another example, using the quad bank SDRAM 200 and provided an initial ACTIVE command is again issued for memory bank 2, command generator 203 can be configured to generate IGA commands sequentially, in order, for bank 2, bank 3, bank 0 and bank 1. In FIG. 3(c), this example contemplates that for IGA$_{a-d}$, a=3, b=0, c=1 and d=2 where IGA$_2$ as depicted by the first dashed IGA$_d$.

Returning to FIGS. 2(a) and (b), bank control logic 210 is coupled to control logic 202 so as to receive issued ACTIVE commands. The ACTIVE commands, so received, are input to the bank control logic's row chain control logic circuits 220. The row chain control logic circuits 220 preferably are associated one-to-one with respective memory banks 116 of SDRAM 200. To illustrate, SDRAM 200 has four memory banks 116 and, as such, bank control logic 210 preferably comprises one row chain control logic circuit 220 for each such bank. It is to be recognized that the circuits 220 can be implemented other than in a one-to-one relationship with the banks 116, without departing from the principles of the invention. For example, a single such circuit 220 can be implemented to function in association with a plural number of banks 116.

Shown in FIG. 2(b) is an example embodiment of a row chain control logic circuit 220, in accordance with the present invention. The circuit 220 comprises a set-reset flip-flop (SRFF) 222. As illustrated, SRFF 222 is implemented as a pair of cross-coupled NAND gates 224, 226. SRFF 222 has a set input terminal 223 and a reset input terminal 221. Because SRFF 222 is implemented with NAND gates, both set and reset inputs are low active. It is recognized that the SRFF 222 can be implemented either/both using circuit elements other than NAND gates and using flip-flops other than set-reset, without departing from the principles of the invention.

Row chain control logic circuit 220 further comprises an input inverter 228. The output terminal of input inverter 228 is coupled to the reset input terminal 221 of SRFF 222. At its input terminal, the input inverter 228 is coupled to receive PRECHARGE commands. Such PRECHARGE commands, as illustrated, are high active, are indicative of memory precharge operations, and typically are decoded from a predetermined combination of external control signals applied to control logic 202. It is to be recognized, however, that a PRECHARGE command may be otherwise provided without departing from the principles of the invention.

Row chain control logic circuit 220 of this example embodiment further comprises command combinational logic 229 coupled to the set input terminal 223 of SRFF 222. The command combination logic 229 is here implemented using a three-input NAND gate 230, an inverter 231 and a two-input NOR gate 232. NAND gate 230 receives at its inputs a bank address signal (BANK), an ACTIVE command and the clock signal (CLOCK). The BANK signal indicates that the bank 116 associated with the particular circuit 220 is addressed by address information registered by address register 104. The ACTIVE command, issued from the control logic 202, indicates that a particular row of a particular bank is to be activated.

The output terminal of NAND gate 230 is coupled, through inverter 231, to a first input terminal of NOR gate 232. The output terminal of NOR gate 232 is coupled to the set input terminal 223 of SRFF 222.

A second input terminal of NOR gate 232 is employed to receive internally generated ACTIVE commands associated with the bank 116 to which the circuit 220 corresponds. As shown, IGA$_n$ is indicative of an embodiment providing a separate such command signal in association with each of the circuits 220 (i.e., in association with each of the "n" memory banks 116, where "n" can equal 1, 2, 4 or otherwise).

The output terminal 235 of SRFF 222 is, for the implementation shown in FIG. 2(b), the output terminal of NAND gate 226. This output terminal 235 is coupled to the input terminal of a first output inverter 234. The output terminal of first output inverter 234 is, in turn, coupled to the input terminal of a second output inverter 236. The output terminal of inverter 236 provides the row chain control logic signal (RCCL) 238 of the circuit 220.

The row chain control logic signal 238 is employed to activate a row of the implicated memory bank 116 so that an access operation (e.g., a read or write) is enabled (in this disclosure, the above-referenced circumstances are sometimes referred to as a "row chain operation"). Once a row chain control logic signal 238 is asserted for a bank 116, the so-activated row remains active until the respective PRECHARGE command is asserted. Assertion of the respective PRECHARGE command resets SRFF 222, terminating the row chain operation.

In standard mode, a row chain operation generally is initiated when the row chain control logic circuit 220 receives both a valid bank address signal (BANK) and a valid ACTIVE command. If each of BANK and ACTIVE is asserted (logically high in the illustrative embodiment) on a positive transition of CLOCK, the output of NAND gate 230 is a logical low, thereby driving the output of the NOR gate 232 to a logical low, via interposed inverter 231. A logical low output of NOR gate 232 comprises an assertion of the set input of SRFF 222 (i.e., set is low active).

During standard mode, internally generated ACTIVE (IGA$_n$) commands preferably are not asserted. However, use of the NOR gate 232 provides that each input, if asserted (e.g., logic high in the illustrative embodiment), is sufficient to drive the output to a logic low, regardless of the other input's state. In any case, the IGA$_n$ and ACTIVE commands preferably are de-asserted prior to an assertion of a PRECHARGE command terminating the row chain operation.

In a non-standard mode, internally generated ACTIVE (IGA$_n$) commands are employed to enable row chain operations. The IGA$_n$ command preferably is a positive pulse of duration sufficient to assert the set input of SRFF 222 (e.g., a pulse of 3 ns duration).

The operation of an integrated circuit in accordance with the present invention is described with reference to the timing diagrams provided in FIGS. 3(a) and 3(b). In these Figures, an access sequence having certain parameters is set forth for illustrative purposes, the parameters including, for example, (i) a sequence of read operations are used to access storage locations across plural (here, all) banks 116, (ii) the initially activated bank is bank 0, (iii) the columns being addressed are changed bank-to-bank, (iv) the output sequence occurs in consecutive clock cycles and (v) the latency of the device is 2 clock cycles. It is to be recognized that one or more of the parameters may be otherwise provided, without departing from the principles of the invention (e.g., the columns being addressed may be the same, bank-to-bank).

Referring to FIG. 3(a), an integrated circuit is illustrated operating in a standard mode. The line denoted by CMD illustrates external control signals corresponding to respective ACTIVE and READ commands for each of the banks 0–3. (Though not illustrated, it is understood that the respective ACTIVE and READ commands are issued, e.g., as decoded by control logic 102 and 202, above.) The line denoted by Add illustrates address information respecting (i) the rows associated with each of the ACTIVE commands and (ii) the columns associated with the READ commands. Each of the external control signals and address information are applied to the integrated circuit from signal sources as described above, or otherwise. The timing of such signals and information, as shown, generally coincides with the positive edge of respective cycles of the clock (CLK) so as to provide for registration of such signals and information.

The line denoted by DQ illustrates an output sequence associated with the ACTIVE and READ commands. This output sequence begins in the sixth clock cycle after the application of external control signals corresponding to the first ACTIVE command. Two of the clock cycles are attributable to the illustrated latency associated with READ commands. The remaining cycles are attributable to the access sequence, particularly the sequence of READ commands used to access storage locations of the activated row (e.g., row "A") across each of banks 0–3.

This standard-mode output sequence concludes in the ninth clock cycle after the application of external control signals corresponding to the first ACTIVE command. Accordingly, the total number of cycles consumed for standard mode access across four banks is ten clock cycles.

Referring to FIG. 3(b), an integrated circuit is illustrated operating in a nonstandard mode toward providing the output sequence shown in FIG. 3(a). Here, the line denoted by External CMD illustrates external control signals corresponding to an individual ACTIVE command for bank 0 and READ commands for banks 0–3. The line denoted by Add illustrates address information respecting (i) a row associated with the ACTIVE command and (ii) the columns associated with the READ commands. Each of these external control signals and address information are applied to the integrated circuit from signal sources as described above, or otherwise. The timing of such signals and information, as shown, generally coincides with the positive edge of respective cycles of the clock (CLK) so as to provide for registration of such signals and information.

The line denoted Internal CMD illustrates the issuance of commands responsive to the external control signals of the External CMD line. Here, the Internal CMD line illustrates that an ACTIVE command associated with bank 0 is issued in the first clock cycle. Subsequent to this initial ACTIVE command, the Internal CMD line illustrates that a series of READ commands are issued, in order, for banks 0–3. These READ commands are issued in consecutive clock cycles 2–5. The issue of the ACTIVE and READ commands is responsive to the registration of external control signals. These control signals are illustrated substantially coincidently with each respective issue in the External CMD line. The timing of such ACTIVE and READ commands, as shown, generally coincides with the positive edge of respective cycles of the clock (CLK) so as to provide for synchronous operations.

Recognizing that FIG. 3(b) reflects a non-standard mode, the line denoted by Internal CMD also illustrates generation of internal commands, specifically IGA commands (as such commands are described above). Here, subsequent to issue of the initial ACTIVE command for bank 0, the Internal CMD line illustrates that a series of IGA commands are generated, in order, for banks 1–3. These IGA commands are generated in consecutive clock cycles 2–4. The generation is substantially coincident (i.e., respecting clock cycles) with issue of READ commands for banks 0–2. It is to be recognized that conflict between coincident IGA and READ commands is precluded by employing separate data paths to the bank control logic 210. The timing of such IGA commands, as shown, generally coincides with the positive edge of respective cycles of the clock (CLK) so as to provide for synchronous operations.

The timing diagram of FIG. 3(b) illustrates that, in this non-standard mode, internal circuitry operates to generate IGA commands that are free of the timing constraints inherent in issuing ACTIVE commands in coordination with, e.g., READ and WRITE commands. In that regard, IGA commands are generated in the absence of and without dependence on substantially coincident application of external control signals. Also, IGA commands are generated in the absence of and without dependence on substantially coincident application of address information as to the row (and/or bank). Rather, IGA commands preferably are generated in conformity with the access sequence; that is, such generation sequence is ordered as to banks implicated by the access, wherein each implicated bank has activated therein the row associated with the initial ACTIVE command.

In FIG. 3(b), the line denoted by DQ illustrates the output sequence of the access sequence. This output sequence begins in the fourth clock cycle after the application of external control signals corresponding to the ACTIVE command. (Two of these clock cycles are attributable to the illustrated latency.) This output sequence concludes in the sixth clock cycle after such signals' application. Accordingly, the total number of cycles consumed for non-standard mode access across four banks is seven clock cycles. This is a reduction of three clock cycles relative to the corresponding, above-described standard mode access.

Embodiments of the present invention, as applied to memory devices, include systems, methods and apparatus for supplying one or more internally generated command sequences to a memory array so that the contents of various storage locations can be accessed in fewer cycles than is possible in conventional access (i.e., via standard mode). These embodiments allow for accessing, particularly in testing, a banked memory array in the absence of and without dependence on application of certain external control signals and address information, e.g., those corresponding to and associated with ACTIVE commands that would typically follow an initial ACTIVE command in standard mode in a selected access sequence.

It is to be recognized that the semiconductor memory can comprise other circuitry and functionality than described herein, without departing from the principles of the invention. As an example, pattern generation circuitry can be provided such that predetermined data is internally generated (e.g., checkerboard and stripe patterns) for writing into the memory array 117. Such pattern generation circuitry preferably (a) is provided in conjunction with, or as part of, the functional logic block 120 and (b) is controlled by the control logic 202. In any case, it is also preferred the pattern generation circuitry be operable with at least the non-standard mode described herein. Such combination of internally generated patterns and internally generated ACTIVE commands would have application for in-field testing of systems that incorporate the so-configured integrated circuits.

In another in-field application, it is also to be recognized that the facility of the present invention can be employed to enhance access of data that generally tends to be arranged in blocks (e.g., generally determinable, relatively adjacent locations, rather than generally indeterminable, random locations), such as might prevail for video, graphics or other multimedia data in numerous digital systems (e.g., personal computers running game software, DVD players, digital televisions, systems using synchronous graphics RAMs, and the like).

As another example, row generation circuitry can be provided such that predetermined sequences of row address information are internally generated in association with one or more of the IGA commands. Such row address information preferably is generated responsive to the row address information associated with the initial ACTIVE command of the selected access sequence. Such row generation circuitry preferably (a) is provided in conjunction with, or as part of, the refresh counter 108 and (b) is controlled by the control logic 202. In any case, it is also preferred the row generation circuitry be operable with at least the non-standard mode described herein.

Figure 4A:
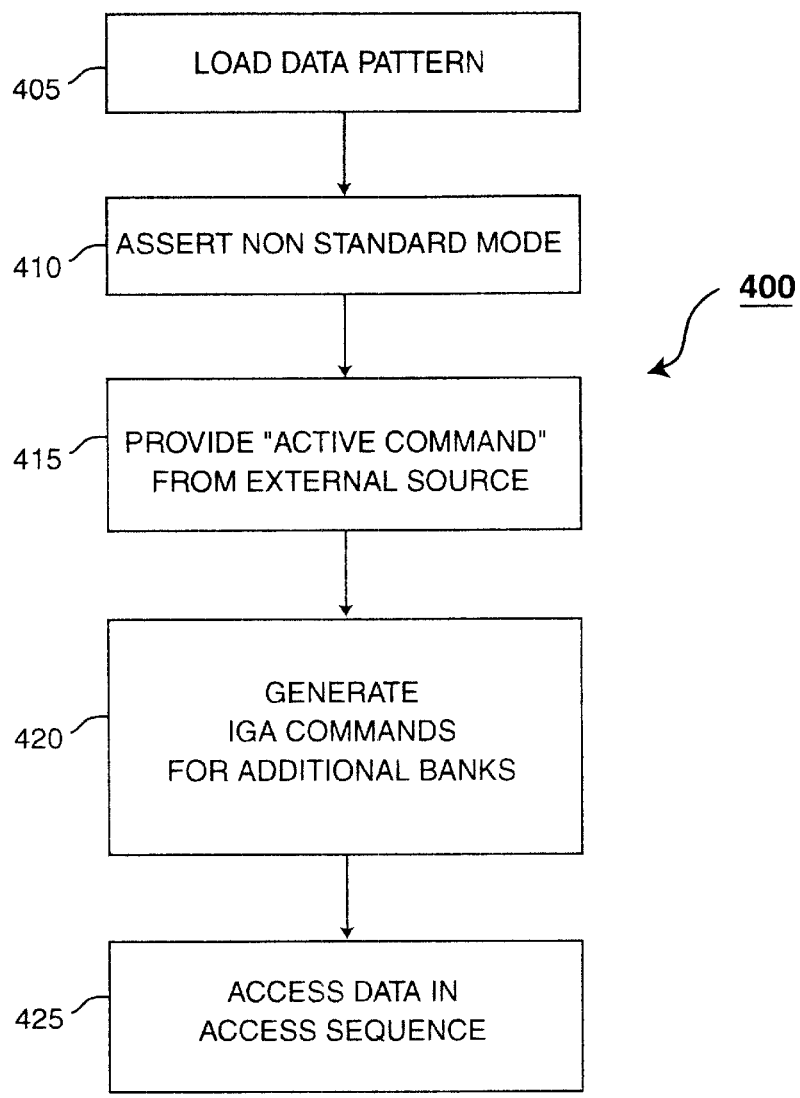
FIG. 4(a) is a flow chart illustrating operation of the SDRAM of FIG. 2(a) in accordance with the present invention.
Figure 4B:
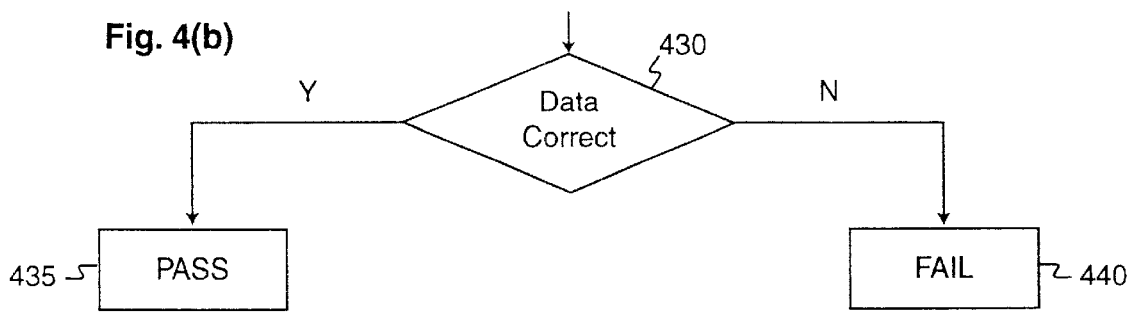
FIG. 4(b) is a flow chart illustrating operation of the SDRAM of FIG. 2(a) in accordance with the present invention.

FIG. 4(*a*) illustrates a process 400, in accordance with the present invention, wherein an integrated circuit is loaded with a selected data pattern in step 405, has enabled therefor a non-standard mode in step 410 and is accessed using such nonstandard mode in subsequent steps.

In a specific embodiment, process 400 is employed to test a memory device. At step 405, the selected data pattern is a test pattern loaded into the device. As stated above, the test pattern can be internally generated by pattern generation circuitry incorporated within the memory device. In general, however, the test pattern is provided from sources external to the memory device.

At step 410, a non-standard mode is asserted which mode provides for generating IGA commands. The assertion of such mode typically is achieved by communicating predetermined control signals to the memory device from a test system. Those skilled in the art having the benefit of this description will recognize that such a test system can be a general programmable IC tester, a custom memory tester, a computer such as a personal computer, or other similar system capable of writing and reading memory devices. Those skilled in the art having the benefit of this description will also recognize that the assertion can be initiated in the absence of such mode control signals, but instead based on recognition of patterns of control signals and/or storage location contents.

Subsequent to asserting the non-standard mode, external control signals corresponding to an ACTIVE command are supplied to the memory device, at step 415. In testing, such control signals typically are supplied by the test system. In accordance with the present invention, registration and decoding of these external control signals triggers issue of an ACTIVE command respecting a particular bank and row. Because the memory device is in non-standard mode, the registration and decoding of these external control signals also initiates generation, at step 420, of IGA commands for memory banks not already selected by the externally-sourced ACTIVE command. That is, an access sequence associated with the non-standard mode and responsive to the ACTIVE command is therewith commenced.

Responsive to the ACTIVE and IGA commands, selected storage location(s) are accessed in agreement with the access sequence, in step 425. In testing, this access typical comprises application of external control signals and associated column/bank addresses associated with a sequence of READ commands. In such case, step 425 provides the contents of the storage locations determined by such addresses, for such banks, relating to the row specified by the ACTIVE command. The contents are directed to the memory device's output terminal(s).

In testing, the contents are typically read by the test system. As illustrated in FIG. 4(*b*), the test system determines, at step 430, whether the data read from the memory device corresponds to the data pattern initially written to the storage locations in step 405. If the read data is correct, the memory device passes the test, at step 435. However, if the read data is not correct, the memory device fails the test, at step 440.

Those skilled in the art having the benefit of this disclosure will recognize that process 400 may be repeated with different applied power supply voltages or test patterns, or both. Similarly, it will be recognized that various other test and measurement conditions, such as the temperature of the device under test, may be varied in combination with other test parameters, all within the scope of the present invention.

Figure 5:
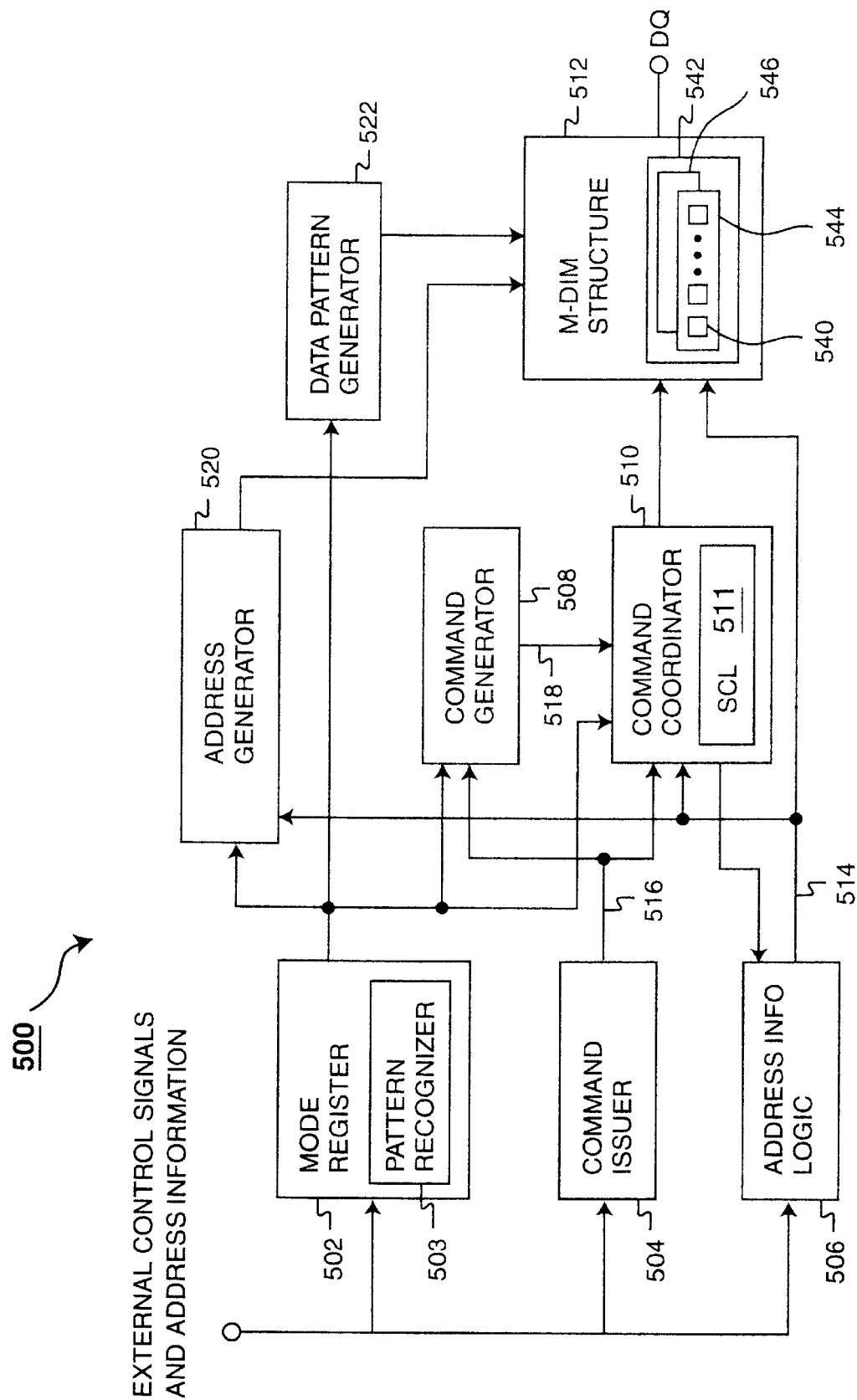
FIG. 5 is a block diagram of an integrated circuit in accordance with the present invention.

FIG. 5 shows a block diagram of a general embodiment of an integrated circuit 500 implemented in accordance with the invention. Integrated circuit 500 comprises mode register 502, command issuer 504 and address information logic 506, each of which is configured to have applied thereto external control signals and/or address information. The integrated circuit further comprises command generator 508, command coordinator 510, and m-dimensional structure 512. The m-dimensional structure 512 comprises a unit circuit element 540 (e.g., a storage location) in plural number, the plurality of such circuit elements 540 being organized using a first dimensional structure 542 (e.g., banks) that comprises second and third dimensional structures 544, 546 (e.g., rows and columns). The first dimensional structure 542 groups and defines the elements 540 in a large granularity relative to one or more of the other dimensional structures 544, 546. The second and third dimensional structures 544, 546 have a selected relative granularity. (The first dimensional structure 542 is sometimes referred to herein as the "superstructure", while the second and third dimensional structures 544, 546 are sometimes referred to herein as "substructures".)

Responsive to applied external control signals, the command issuer 504 issues selected commands, the commands being provided via a first data path 516 to selected integrated circuit elements, including the command generator 508 and the command coordinator 510.

The address information logic 506 is configured to receive and latch address information, such information being employed to select among the dimensional structures 542, 544, 546. The address information logic 506 is coupled via second data path 514 to selected integrated circuit elements, including to the command coordinator 510 and to the m-dimensional structure 512, so as to provide such information to these circuit elements.

Mode register 502 enables control of the integrated circuit's mode of operation. More specifically, mode register 502 is employed both (a) toward determining the implicated mode and (b) enabling operation of the integrated circuit under the implicated mode. Mode register 502 can be variously implemented, including by providing logic that decodes external control signals corresponding to loading of a mode (i.e., mode load signals), as well as by providing pattern recognizer 503 to recognize patterns of external control signals, address information and/or states of one or more unit circuit elements 540, so as to adaptively determine/enable modes.

Mode register 502 issues internal control signals appropriate to the implicated mode, including any non-standard mode. To illustrate, mode register 502 provides an IGC_MODE control signal that enables the integrated circuit's operation in a nonstandard mode characterized by internal generation of a selected command or commands, such as for accessing the unit circuit elements 540. To illustrate further, mode register 502 also provides an internal control signal that enables standard mode operation.

Command generator 508 is coupled to the mode register 502 and, as stated, to the command issuer 504. So coupled, command generator 508 receives not only commands issued by the command issuer 504, but also one or more internal control signals provided by the mode register 502. Command generator 508 preferably is responsive to predetermined combinations of such received commands and signals. As an example, command generator 508 may be enabled to generate commands referencing the superstructure 542, provided that (i) a non-standard mode is set in place via an IGC_MODE control signal received from the mode register 502 and (ii) either a valid, initially-issued command is received from command issuer 504 or some predetermined event arises. Such an event preferably entails either a calculus or a stimulus. One example stimulus includes clock cycles; to illustrate, once generation of commands has been initiated, clock cycles preferably are employed to trigger generation of commands across a selected portion of the superstructure 542 in a synchronous embodiment subject to and conforming with a selected access sequence.

The command generator 508 preferably generates commands (a) in the absence of and without dependence on application of external control signals and (b) in the absence of substantially coincident application of associated address information. The generated commands are provided to the command coordinator 510 via third data path 518. Accordingly, the internally generated commands do not consume bandwidth of the first and second data paths 514, 516 by which issued commands and associated address information are respectively conveyed within the integrated circuit 500; accordingly, total clock cycles are enabled to be reduced in accessing across portions of the superstructure 542 of the m-dimensional structure 512 pursuant to an access sequence. The internally generated commands preferably have function corresponding to the selected commands that they replace.

Command coordinator 510 is coupled to command issuer 504 and to the command generator 508 so as to receive, respectively, issued and generated commands. Command coordinator 510 is also coupled to the address information logic 506 so as to receive address information, e.g., addresses of implicated portions of the superstructure. Command coordinator 510 is coupled to provide access control signals to each of the m-dimensional structure 512 and to the address information logic 506. The coupling to the m-dimensional structure 512 is toward enabling accesses of predetermined portions of the first, second and third dimensional structures 542, 544, 546. The coupling to the address information logic 506 is toward directing such logic to provide to the structure 512 address information relevant to the generated commands.

The commands and address information, as received by the command coordinator 510, preferably are employed by the coordinator's one or more structure control logic circuits 511. Each of the structure control logic circuits 511 preferably is associated one-to-one with predetermined portions of the superstructure 542 and/or with predetermined portions of either/both of the substructures 544, 546. It is to be recognized that the circuits 511 can be implemented other than in a one-to-one relationship, without departing from the principles of the invention.

The structure control logic circuits 511 are employed to enable accessing the predetermined portions of the first, second and third dimensional structures 542, 544, 546 associated with the circuits 511. In operation, compound commands (e.g., such command comprising both a primary command and a secondary command, these component commands being provided in one or more cycles so as to effect a single operation) are employed to convey the dimensional addressing associated with an accessed portion of the m-dimensional structure 512. Moreover, component commands of the compound commands can be generated by the command generator 508 and/or issued by the command issuer 504.

In addition, one or more access sequences can be supported by which predetermined portions of the m-dimensional structure 512 are accessed via an ordered, coordinated sequence of compound commands. If, in any such access sequence, all component commands are issued by the command issuer 504, the integrated circuit 500 is characterized as operating in a standard mode. If, in any such access sequence, some component commands are generated by the command generator 508, the integrated circuit 500 is characterized as operating in a non-standard mode.

As an example of operation in non-standard mode, a first command is issued responsive to external control signals. The first command is associated by the address information both with a particular portion of one of the substructures 544, 546 and, because the integrated circuit 500 is organized having a superstructure 542, with a particular portion thereof. Correlating, in function, to this first command, are one or more commands generated by the command generator 508, such generated commands having generated address information. The generated commands preferably address across the superstructure 542, e.g., by a sequence of the superstructure's portions having a predetermined order in conformity with a selected access sequence.

In addition, these generated commands preferably comprise a substructure address. The address preferably is determined based on such first command's substructure address. For example, the address can be copied or calculated from such first command's substructure address. In the case of copying, the address is provided from the address information logic 506, responsive to an access control signal applied from the command coordinator 510. In the case where the address determination for generated commands is by some calculation, an address generator 520 is employed which, as shown in FIG. 5, preferably is coupled to receive inputs from each of mode register 502 and address information logic 506 and is coupled to the m-dimensional structure 512 to convey address information. Because the generated commands' addressing can be provided via either/both of these two cases, the integrated circuit 500 preferably supports some form of arbitration. In one embodiment, arbitration is provided by the mode register 502 providing appropriate internal control signals to each of the address generator 520 and the command coordinator 510, whereby the command coordinator 510 overrides the address information logic's addressing when the address generator 520 is enabled.

Continuing in the example, issued in coordination with these generated commands are additional commands that specify one or more addresses of a remaining (i.e., not previously addressed) substructure 544, 546. These additional commands are issued responsive to further external control signals. These additional commands relate, and preferably are referenced, to respective portions of the superstructure 542 of the access sequence described by the first issued and the subsequently generated commands. The command coordinator 510 coordinates such generated and issued commands so as to control/enable access in conformity with the access sequence.

The coordination between each generated command and each issued additional command entails recognition of the operation of compound commands and effecting timing relationships engendered by the structure of the integrated circuit 500. As an example, the initial additional command typically is issued following in some timing relationship the issue of the first command. Thereafter, each additional command typically is issued following in some timing relationship the generated command to which the additional command relates. (The applicable timing relationship is sometimes referred to herein as the "offset".)

Referring to FIG. 3(b), coordination is illustrated. There, at each clock cycle, (i) a current READ command is issued to complete a compound command initiated by an IGA command generated at the previous clock cycle and (ii) a current IGA command is generated initiating a compound command that is completed in the next clock cycle by issue of another READ command.

As shown in FIG. 5, the integrated circuit 500 can be implemented employing a data pattern generator 522. Such generator 522 preferably is coupled to the mode register 502 so as to receive control signals directing its operation. Such generator 522 preferably is also coupled to the m-dimensional structure 512 so as to provide thereto its generated data patterns. Such data patterns can be provided for operations, storage, testing or other purposes.

The present invention provides methods and apparatus for effectively accessing an integrated circuit having a unit circuit element (e.g., a storage location) in plural number, the plurality of such circuit elements being organized in an m-dimensional structure (e.g., banks, rows and columns) with one such dimensional structure being a superstructure (e.g., banks) to one or more of the other dimensional structures, such other dimensional structures thereby being substructures (e.g., rows and columns). The accessing relies on a mode wherein an access sequence is selected and, responsive thereto, certain commands are generated internally in the absence of, and without dependence on, substantially coincident application of external control signals and address information typically associated with the functionality provided by such commands.

An advantage of embodiments of the present invention is that testing of an integrated circuit can be accomplished more quickly, and therefore more cost-effectively (i.e., a selected number of elements of the circuit can be tested in fewer clock cycles). Another advantage is that certain in field operations are enhanced.

It will be understood that various other changes in the details, materials, and arrangements of the parts and steps which have been described and illustrated in order to explain the nature of this invention may be made by those skilled in the art without departing from the principles and scope of the invention as expressed in the appended claims.

What is claimed is:

1. A method of accessing storage locations of a semiconductor memory, the storage locations organized in rows, columns and banks, the method comprising:

issuing an activating command responsive to external control signals;

associating with the issued activating command selected address information, the selected address information specifying a bank;

issuing one or more access commands responsive to further external control signals;

associating with each issued access command selected address information, the selected address information of a respective access command specifying a column a bank;

generating one or more activating commands;

generating address information relevant to the generated activating commands; and associating with each generated activating command selected generated address information, the selected generated address information of a respective generated command specifying a bank, the banks specified by the generated activating commands being congruent to the banks specified by the issued access commands.

2. The method of claim 1, wherein associating selected generated address information comprises conforming to a selected access sequence, the access sequence directing addressing across selected banks of the memory array in a predetermined order.

3. The method of claim 2, wherein conforming to a selected access sequence comprises wrapping around all or part of the sequence comprises at least one of maintaining a fixed bank, repeating one or more banks in the sequence, excluding one or more banks in the sequence, including all banks in the sequence before any bank is repeated, and wrapping some or all of a sequence.

4. The method of claim 2, wherein associating selected address information with the issued activating command comprises associated a row address, and wherein associating selected generated address information comprises, for each generated activating command, determining a row address from the row address information of the issued activating command.

5. The method of claim 4, wherein associating selected address information with each issued access command comprises specifying a column.

6. The method of claim 1, wherein associating selecting address information with the issued activating command comprises associating a row address, and wherein associating selected generated address information comprises, for each generated activating command, determining a row address from the row address information of the issued activating command.

7. The method of claim 6, wherein determining a row address from the row address information of the issued activating command comprises employing the row address information of the issued activating command.

8. The method of claim 1, further comprising providing address information relevant to at least one of an issued activating command and an issued access command, and associating of selected address information is based on the provided relevant address information.

9. The method of claim 1, further comprising selecting a mode of operation supporting internal generation of at least one of an activating command and associated address information thereof.

10. The method of claim 9, wherein selecting a mode of operation comprises issuing a predetermined internal control signal responsive to one or more of (a) external control signals, (b) address information, (c) states of one or more storage locations and (d) performance of the semiconductor memory or any components thereof.

11. The method of claim 9, further comprising switching to or from a mode in which all of the activating commands are issued responsive to external control signals.

12. The method of claim 1, further comprising coordinating the offset applicable to related each generated activating command and each issued access command.

13. The method of claim 12, wherein the coordinating step comprises, at selected clock cycles during a selected access sequence, both (i) issuing a first access command at a current clock cycle for accessing based on a first activating command generated at a previous clock cycle and (ii) generating a second activating command so as to initiate accessing that is completed in a subsequent clock cycle by issue of a second access command, while (iii) maintaining a selected timing relationship, measured in clock cycles, between the current clock cycles and respective said previous and subsequent clock cycles.

14. The method of claim 1, further comprising generating patterns of test data for writing to and reading from the memory array.

15. The method of claim 1, wherein associating selected address information with each issued access command comprises specifying a column.

16. The methof of claim 15, further comprising supporting address information relevant to the access commands that, for at least two of the access commands, is divergent by column across the specified banks.

17. A method of accessing storage locations of a semiconductor memory, the storage locations organized in rows, columns, banks and one or more higher dimension structures, the method comprising:

issuing an activating command responsive to external control signals;

associating with the issued activating command selected address information, the selected address information specifying at least one of a bank and a higher dimension structure;

issuing one or more access commands responsive to further external control signals;

associating with each issued access command selected address information, the selected address information of a respective access command specifying at least one of a bank and a higher dimension structure;

generating one or more activating commands;

generating address information relevant to the generated activating commands; and associating with each generated activating command selected generated address information, the selected generated address information of a respective generated command specifying at least one of a bank and a higher dimension structure, the at least one of a bank and a higher structure specified by the generated activating commands being congruent to the at least one of a bank and a higher dimension structure specified by the issued access commands.

18. The method of claim 17, wherein associating selected generated address information comprises conforming to a selected access sequence, the access sequence directing, in a predetermined order, addressing across at least one of one more selected banks or one or more higher dimension structures.

19. The method of claim 18, wherein associating selected address information with the issued activating command comprises associated a row address, and wherein associating selected generated address information comprises, for each generated activating command, determining a row address from the row address information of the issued activating command.

20. The method of claim 19, wherein associating selected address information with each issued access command comprises specifying a column.

* * * * *

UNITED STATES PATENT AND TRADEMARK OFFICE
CERTIFICATE OF CORRECTION

PATENT NO.     : 6,526,533 B1
DATED          : February 25, 2003
INVENTOR(S)    : Timothy B. Cowles and Jeffery P. Wright It is certified that error appears in the above-identified patent and that said Letters Patent is hereby corrected as shown below:

<u>Column 3,</u>
Line 24, after "operating" please delete "." (the period).

<u>Column 18,</u>
Line 14, after "specifying" please delete "a column".
Lines 32-33, after "sequence" please delete "comprises wrapping around all or part of the sequence".

<u>Column 19,</u>
Line 21, after "current clock" please replace "cycles" with -- cycle --.

Signed and Sealed this

Twenty-sixth Day of August, 2003

JAMES E. ROGAN
*Director of the United States Patent and Trademark Office*